United States Patent [19]

Barrett et al.

[11] Patent Number: 4,510,404
[45] Date of Patent: Apr. 9, 1985

[54] MOUNTING FOR ELECTRONIC CIRCUIT BOARD IN POWER HAND TOOL

[75] Inventors: Michael E. Barrett, Easley; Randy G. Koon, Pickens, both of S.C.; Thomas C. Laughon, Alpharetta, Ga.

[73] Assignee: The Singer Company, Stamford, Conn.

[21] Appl. No.: 480,982

[22] Filed: Mar. 31, 1983

[51] Int. Cl.³ .............................................. H02K 7/14
[52] U.S. Cl. ........................................ 310/50; 310/89
[58] Field of Search ............................ 310/47, 50, 89; 366/200; 174/52 R; 340/641; 200/5 A, 6 A; 361/395, 399; 220/85 D, 85 H; 241/101.1

[56] References Cited

U.S. PATENT DOCUMENTS

| 3,475,540 | 11/1969 | Fox | 310/89 |
| 3,951,351 | 4/1976 | Ernster et al. | 366/200 |
| 4,092,698 | 5/1978 | Brefka | 361/399 |
| 4,386,776 | 6/1983 | Bromley | 273/85 G |
| 4,451,693 | 5/1984 | Vest | 174/52 R |

Primary Examiner—William H. Beha, Jr.
Assistant Examiner—D. L. Rebsch
Attorney, Agent, or Firm—Edward P. Schmidt; Robert E. Smith; Edward L. Bell

[57] ABSTRACT

An electronic control board implemented by a printed circuit board is supported on a flexible lens or bezel which may be flexed to allow insertion, so as to be retained. The edges of the bezel are received in the interior periphery of an opening in a support housing, which opening is closed off by the bezel and by a cap which retains the exposed periphery of the bezel in its interior portion. Lugs may extend from the support housing and the cap against the printed circuit board to provide better support. The entire assembly is maintained unitary and retained to a power tool by fastening means such as screws extending therethrough and into the power tool.

7 Claims, 5 Drawing Figures

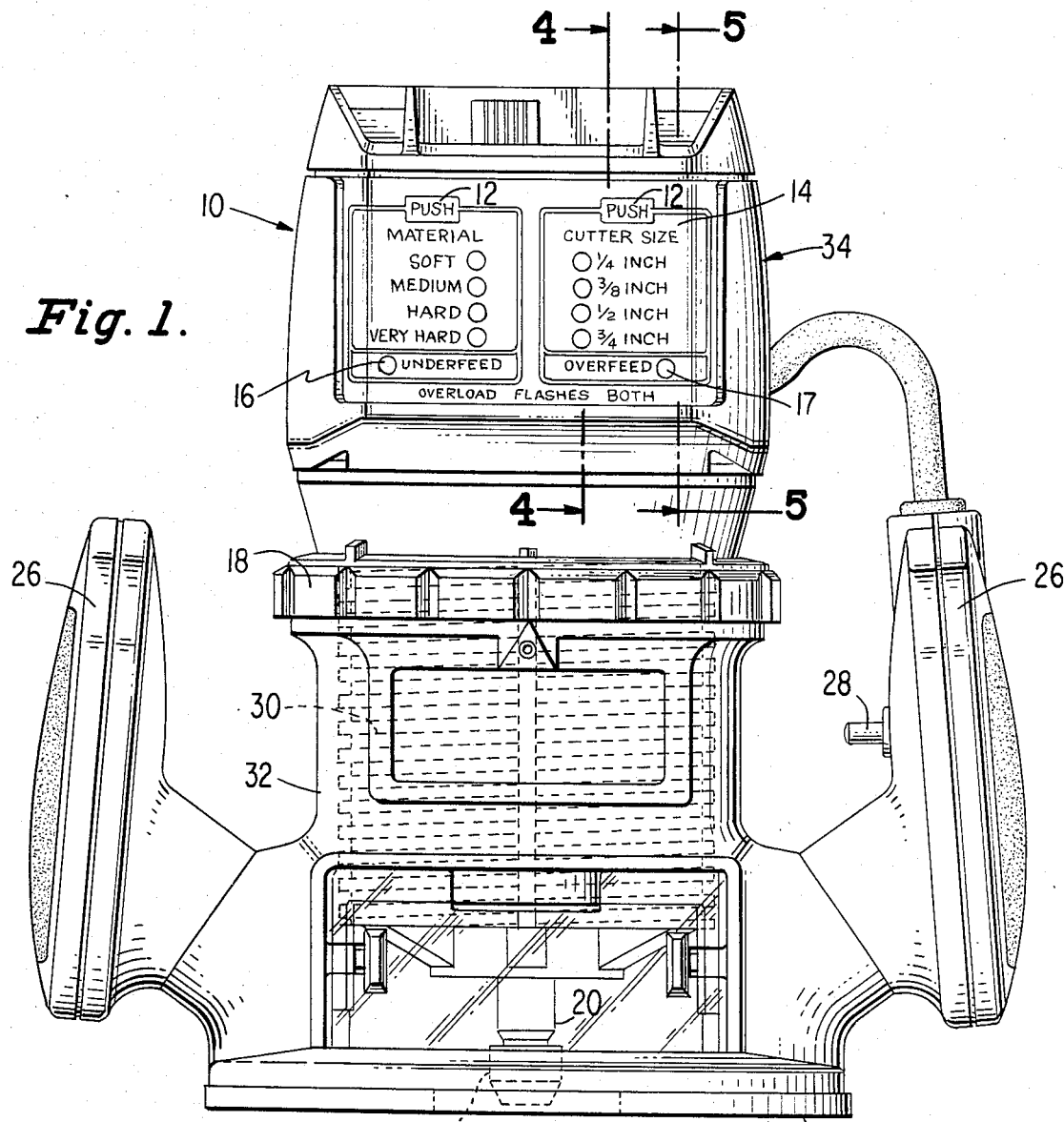
*Fig. 1.*
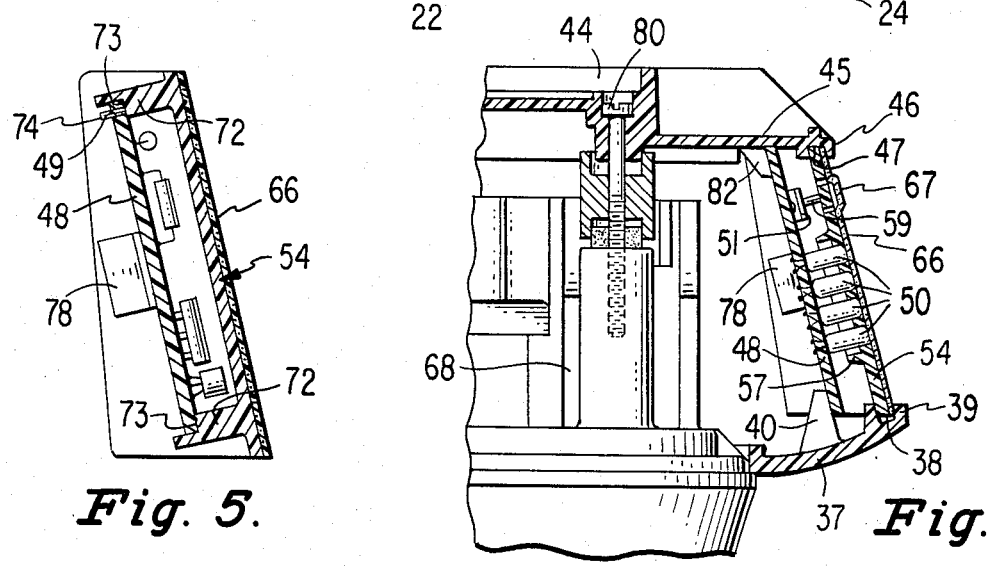
*Fig. 5.*  *Fig. 4.*

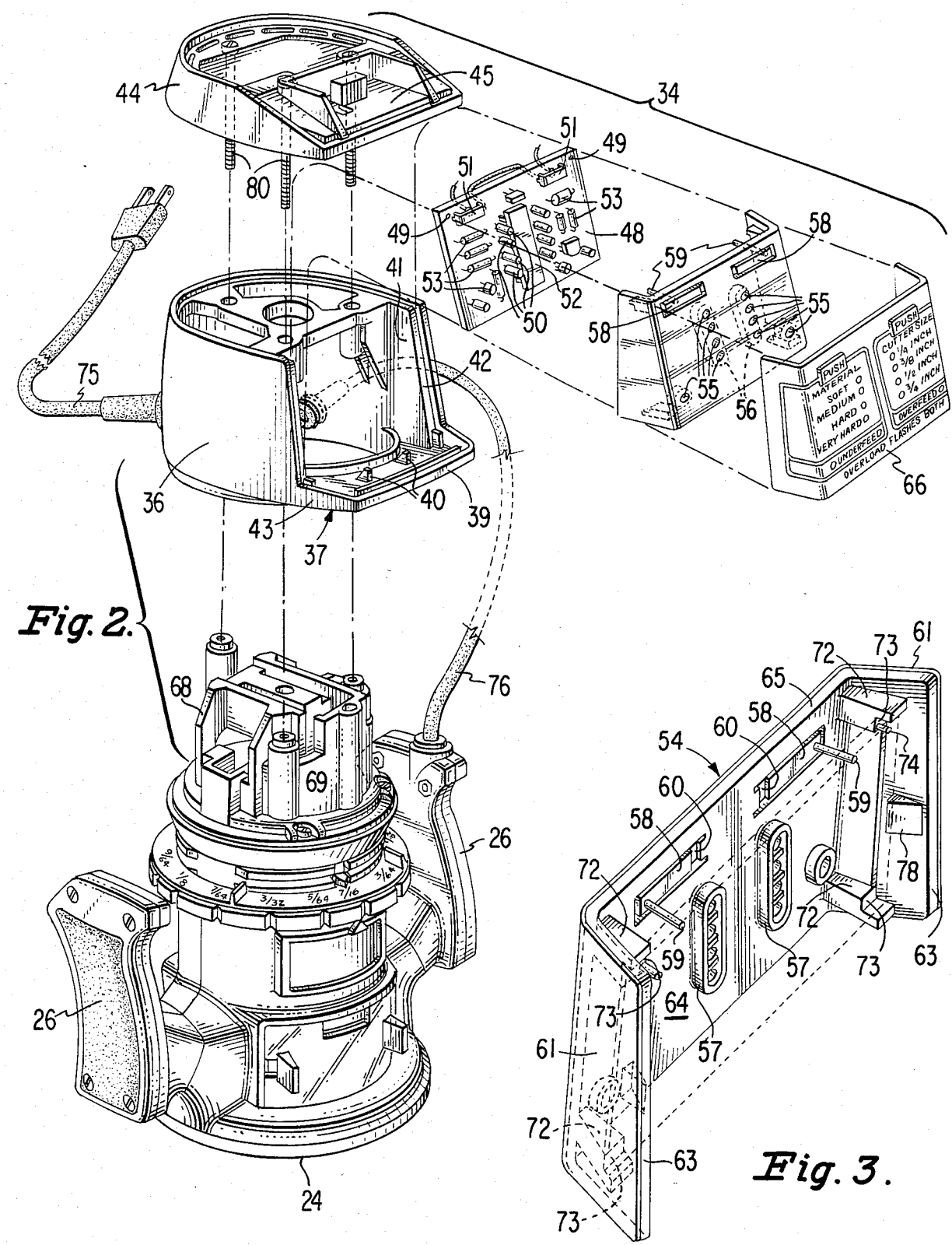

MOUNTING FOR ELECTRONIC CIRCUIT BOARD IN POWER HAND TOOL

DESCRIPTION

BACKGROUND OF THE INVENTION

This invention is in the field of power hand tools; more particularly, it is concerned with the mounting for an electronic control board in a power hand tool.

The miniaturization of electronic circuitry, which has given rise to the computer "chip", has enabled the use of computer control for portable hand held power tools. However, hand held power tools are not always subject to careful handling and usage. Accordingly, the necessity arises to provide an economical means, compatible with high production, for supporting the electronic devices against mechanical shock. At the same time, it is desirable to provide double insulation of the electronic components to avoid the necessity for grounding the power tool while still providing projection for an operator in those arrangements providing operator selection capability. It is also desirable to protect the electronics in these power tools from the contamination and dirty atmosphere in which these tools frequently operate.

SUMMARY OF THE INVENTION

The above desired ends are contained in a construction in which a bottom cap or support housing covers and is supported by a top bearing plate for a router. The bottom cap is fashioned with an outwardly extending lip having a groove immediately adjacent the outer edge thereof and a pair of upstanding lugs spaced behind the groove. A lens of bezel is designed to be carried on the outwardly extending lip with the bottom edge thereof situated in the groove adjacent the outer edge of the bottom cap. The bezel is fashioned with two columns of four apertures each, each of the columns being hooded by a wall projecting rearwardly from the bezel, which wall surrounds all four apertures. At the top of each column of apertures in the bezel are oppositely directed fingers which are unattached to the bezel on three sides, but are attached to the bezel only on sides adjacent each other. The free ends of the fingers are fashioned with rearwardly directed rod. The bezel is fashioned with inwardly extending sides which terminate in rabbetted edges on sides extensions of the bottom cap which extends halfway along both sides of the outwardly extending lip. A vertical stand off rib extends inwardly from each corner of the bezel adjacent the inwardly extending sides thereof. A pair of the vertical stand off ribs is fashioned with inwardly extending posts. A printed circuit board is fashioned with apertures matching the inwardly extending posts so as to receive these posts when seated on the vertical stand off ribs. The inwardly extending sides of the bezel are fashioned with ramped surfaces having bottom edges spaced from the vertical stand off ribs approximately the thickness of the printed circuit board. As the printed circuit board is forced over the ramped surfaces of the inwardly extending sides of the bezel, these sides and the bezel deflect to allow passage of the printing circuit board and entrance of the inwardly extending posts on the vertical stand off ribs into the apertures in the circuit board therefor, so as to locate and trap the printed circuit board on the bezel. Light emitting diodes (LED) supported on the printed circuit board extend into the hood surrounding the two columns of four apertures, with a LED for each aperture. The rod affixed to the ends of the fingers on the lens are spaced from switches carried by the printed circuit board, with there being sufficient deflection of the fingers permitted by the bezel material to actuate the switches. The upstanding lugs of the bottom cap engage the bottom surface of the printed circuit board for additional bracing and support of the same. A top cap is provided having an outwardly extending lip with an outer edge and a groove situated behind the outer edge. The top edge of the bezel is captured in this groove, and a lug extending downwardly from the top cap engages the top edge of the printed circuit board, additionally to brace the support the same. Three screws are provided to retain the lens and printed circuit board assembly between the top and bottom caps, and to retain the entire cap assembly to the top bearing plate of the router. A translucent membrane may be provided to cover the forward surface of the bezel and provide indicia and instructions to an operator.

BRIEF DESCRIPTION OF THE DRAWINGS

The above objects and advantages of the present invention will become more readily apparent from the following description, reference being had to the accompanying drawings in which:

FIG. 1 is a front elevation of the router in which the invention has been incorporated;

FIG. 2 is an exploded perspective of the top portion of the router shown in FIG. 1;

FIG. 3 is a rear perspective of the bezel shown in FIG. 2;

FIG. 4 is a cross-section taken along the lines 4—4 of FIG. 1; and

FIG. 5 is a cross section taken along line 5—5 of FIG. 1.

Referring to FIG. 1, there is shown an electronically controlled router 10 which may be of the type shown in the commonly assigned, U.S. patent application Ser. No. 385,634, filed on June 7, 1982. In that application is disclosed a hand held power tool in which a computer is responsive to operator selection of material hardness and of cutter implement size, to regulate motor speed to an optimum value determined from a table stored in a memory in the computer. Material selection and cutter size selection is implemented by depression of areas 12 in a panel 14 of the router 10. Indicators 16, 17 are provided in the panel 14 to indicate to an operator the existence of an operator impoesed condition of too slow or too fast, respectively, a feed rate for an optimum finish for the material and cutter size selected.

In the router 10, a depth ring 18 may be rotated to extend or retract a spindle 20, which spindle terminates in a collet 22 for receiving and holding a tool bit (not shown). The extension of the tool bit beyond a base 24 of the router 10 determines the depth of cut. Hand grips 26 are gripped by an operator in guiding the router 10 over the work material. The router 10 may be locked in an operative position by the trigger lock 28 in the right hand grip 26 which operates on a trigger therein (not shown). Essentially, the router 10 comprises a motor having the output spindle 20 and externally threaded motor housing 30 situated internally of a aluminum housing 32 extending upwardly from the base 24, with the internally threaded depth ring 18 determining the position of the motor housing 30 within the outer housing 32.

The electronic control for the router 10 is situated in the cap construction 34, the details for which are more readily apparent from an inspection of FIG. 2. The cap construction 34 includes a bottom cap or support housing 36, a top cap 45, a printed circuit board 48, a lens or bezel 54 and an adhesive backed membrane 66 for attachment to the bezel to provide a panel 14 for the router 10. The bottom cap 36, which is made from a insulating material, covers a top bearing plate 68 for the router 10, and fits closely about a shelf 69 thereof. The bottom cap 36 is formed with an outwardly extending lip 37, which lip has a groove 38 behind a raised outer edge 39 thereof, which raised edge extends about the entire periphery of the outwardly extending lip. A pair of upstanding lugs 40 are spaced behind the groove 38 for a purpose to be explained below.

The bezel 54 is formed as the bottom cap 36 from an insulating material having, however, some flexibility; such as a plastic material. The bezel 54 herein is fashioned with ten apertures 55 which extend therethrough from the outside to the inside. Some of the apertures 55 are arranged in two columns 56 of four each. Projecting rearwardly from the inner surface of the bezel 54 are walls 57 forming hoods surrounding the columns 56 of apertures. Situated above the columns 56 are two oppositely directed fingers 58 which are attached to the bezel 54 only at reduced thickness areas 60, so that the free ends of the fingers may flex inwardly with respect to the bezel. The free ends of the fingers 58 are fashioned with rods 59 inwardly directed substantially normal to the bezel surface. The bezel 54 is further fashioned with inwardly extending side 61. The bottom 62 of the bezel 54 fits within the groove 38 of the outwardly extending lip 37 of the bottom cap 36, and the inwardly extending sides 61 of the bezel 54 fit within the raised side edges 43 of the outwardly extending lip 37 to have the inner edges 63 thereof abut rabbetted edges 42 on side extensions 41 of the bottom cap.

The bezel 54 is further fashioned with stand off ribs 72 extending substantially normal to the inner surface 64 at the four corners thereof adjacent the inwardly extending sides 61 thereof. The stand off ribs 72 may be rabbetted 73 so as to accommodate the printed circuit board 48. Certain of the stand off ribs 72 may be fashioned with posts 74, which posts hich may be accommodated in apertures 49 in the printed circuit board 48 for the purpose of accurately locating the same with respect to the bezel 54.

The inwardly extending sides 61 of the bezel 54 are further formed with inwardly opening ramped surfaces 78, which ramped surfaces terminate from a plane including the rabbetted surface 73 a sufficient distance to accommodate the thickness of the printed circuit board 48. The printed circuit board 48 is inserted in the bezel 54 by inserting one side of the printed circuit board in the rabbets 73 of two stand off ribs 72, beneath one of the ramped surfaces 78, with an aperture 49 engaged with a post 74 of one of the stand off ribs, and by sliding the opposite edge of the printed circuit board down the other ramped surface 78 until the other post 74 is engaged with the other aperture 49 in the printed circuit board and the printed circuit board rests upon the rabbets 73 of the other stand off ribs 72. The plastic material of the bezel 54 must deflect sufficiently for the printed circuit board 48 to be received therein, and spring back to retain the same firmly.

The printed circuit board 48 carries thereon sufficient light emitting diodes (LEDS) to coincide with apertures 55 in the bezel 54. The printed circuit board 48 also carries two switches 51 situated behind the rod 59 of the fingers 58 so as to be actuated by depression thereof. Further, the printed circuit board 48 carries a microprocessor chip 52 and other electronic components 53 which form part of the circuit arrangement for controlling the operations of the router 10. A power cord 75 is provided for connecting the printed circuit board and the electronic components supplied thereon to a source of power, and a second cord 76 extends from the right hand grip 26 containing the trigger switch (not shown) to these electronic components in order to signal operator initiation of operation of the router 10.

Referring to FIG. 4, the mounting of the printed circuit board 48 in the bezel 54 is shown with the LEDS 50 extending into the hood 57 to the apertures 55 in the bezel. In this view, the top cap 44 is shown also having an outwardly extending portion 45 with a lowered outer edge 46, immediately adjacent to which is a groove 47. The groove 47 receives the upper edge 65 of the bezel 54 when the top cap 44 is positioned over the bottom cap 36. Also shown in FIG. 4 is one of the three screws 80 shown in FIG. 2 which extends through the top cap 44 and the bottom cap 36 to retain the two caps and the bezel and printed circuit board captured therein, to the top bearing plate 68 for the router 10. Extending downwardly from the outwardly extending portion 45 of the top cap 44 is lug 82 which bears against the printed circuit board 48 to provide additional support therefor. The outer edge 46 of the outwardly extending portion 45 of the top cap 44 also extends about the sides of the outwardly extending portion so as to extend about the top of the inwardly extending sides 61 of the bezel 54. The membrane 66 attached to the bezel 54 is formed with a raised area 67 to indicate the location of the fingers 58. The rods 59 extending from the fingers 58 can be seen to extend to the switch 51 supported on the printed circuit board 48.

Referring to FIG. 5, there is disclosed in more detail the arrangement of the printed circuit board 48 in the bezel 54 as it is carried by the rabbets 73 of the stand off ribs 72. The post 74 is shown extending through the aperture 49 in the printed circuit board to locate the same on the bezel 54. It is apparent from an inspection of FIGS. 3 and 5 that the printed circuit board 48 is trapped on the bezel 54 between the ramped surfaces 78 and the stand off ribs 72.

What has been disclosed herein is a construction for supporting a printed circuit board and the electronic elements carried thereon in a portable hand tool to seal the electronics against contamination, provide double insulation and provide some mechanical shock isolation for the electronics. It will be undersood that various changes in the details, materials, arrangements of parts and operating conditions which have been herein described and illustrated in order to explain the nature of the invention may be made by those skilled in the art within the principles and scope of the invention.

We claim:

1. In a power hand tool, a mounting arrangement for an electronic control comprising:
   a printed circuit board carrying electronic components thereon to implement said electronic control;
   a bezel fabricated from an insulating material and formed with stand off ribs extending substantially normal thereto, said stand off ribs having rabbetted surfaces spaced apart to receive said printed circuit board, means for selectively retaining said printed circuit board on said rabbetted surfaces of said stand off ribs of said bezel;

a support housing of said power tool fabricated from an insulating material, said support housing as carried on said power tool having an outwardly directed opening therein, means on said opening for supporting an edge portion of said bezel in the interior of said housing with said printed circuit board in said support housing;

a cap fabricated from an insulating material and covering with said bezel said opening in said support housing, means on said cap for sustaining the remaining edge portion of said bezel in the interior of said cap; and, means for retaining said cap, bezel and support housing in an assembled condition to said power hand tool.

2. In a power hand tool as claimed in claim 1 wherein said bezel is fabricated from a flexible insulating material and further comprises and outwardly facing wall having and inwardly facing side from which said stand off ribs project, oppositely disposed inwardly extending sides adjacent said stand off ribs, and means responsive to flexing of said bezel to enable insertion of said printed circuit board to said rabbetted surfaces for retaining said printed circuit board affixed to said bezel.

3. In a power hand tool as claimed in claim 2 wherein said retaining means further comprises inwardly opening ramped surfaces on said inwardly facing sides, said ramped surfaces terminating from a plane including the rabbetted surfaces a distance sufficient to accommodate the thickness of said printed circuit board, said ramped surfaces being spaced apart less than the width of said printed circuit board, whereby said printed circuit board may be inserted along said ramped surfaced to influence flexing of said bezel to permit seating of the printed circuit board on the rabbetted surfaces and retention thereon by the positioning of said ramped surfaces over said printed circuit board in the reflexed state of said bezel.

4. In a power hand tool as claimed in claim 3, said support housing further comprising a lug extending therefrom contiguous said printed circuit board, and said cap further comprises a lug extending therefrom contiguous said printed circuit board, whereby said printed circuit board is further supported by said lugs.

5. In a power hand tool as claimed in claim 3, said bezel further comprising extending through said outwardly facing all and a post extending from at least one of said rabbetted surfaces of said stand off ribs, and said printed circuit board further comprising apertures for accommodating said posts to accurately locate said printed circuit board and electronic components supported on said printed circuit board such as light emitting diodes for extending to said apertures of said outwardly facing wall.

6. In a powwer hand tool as claimed in claim 5, said bezel further comprising an inwardly directed wall surrounding said apertures on said inwardly facing side extending about said light emitting diodes.

7. In a power hand tool as claimed in claim 4, wherein said supporting means and said sustaining means further comprises grooves and rabbetted edges in said support housing and in said cap.

* * * * *